TRANSISTOR SIGNAL AMPLIFIER CIRCUITS

Original Filed May 28, 1953

INVENTOR.
ROBERT D. LOHMAN
BY H. D. Newton
ATTORNEY

United States Patent Office 2,851,542

Patented Sept. 9, 1958

2,851,542

TRANSISTOR SIGNAL AMPLIFIER CIRCUITS

Robert D. Lohman, Princeton, N. J., assignor to Radio Corporation of America, a corporation of Delaware Continuation of application Serial No. 357,954, May 28, 1953. This application May 17, 1956, Serial No. 585,521

6 Claims. (Cl. 179—171)

This application is a continuation of my copending application Serial No. 357,954, filed on May 28, 1953, now abandoned, entitled "Reduction of Distortion in Semi-Conductor Amplifier Circuits."

This invention relates generally to signal amplifier circuits having two signal paths arranged for push-pull operation and particularly to semi-conductor signal amplifier circuits of that type.

Two classes of semi-conductor devices have been utilized in signal amplifier circuits to which the present invention pertains. One class is a junction transistor which comprises a semi-conductive body having two end zones of one type of semi-conductive material separated by and contiguous with an intermediate zone of opposite type of semi-conductive material. Electrodes are placed in essentially low-resistance contact with the respective zones to provide means for external circuit connections. The electrodes which are in contact with the respective end zones are termed the emitter electrode and the collector electrode respectively. The electrode which is in contact with the intermediate or center zone is termed the base electrode. The junction transistor can then, of course, be of the N–P–N type or the P–N–P type. These two types of junction transistors will hereinafter be referred to as being opposite conductivity types.

The second class of semi-conductor devices is known as the point contact transistor which comprises a semi-conductive body having two electrodes in high-resistance or rectifying contact therewith and a third electrode in low-resistance contact therewith. The semi-conductive body may be a germanium or silicon crystal of the N or P type. The two electrodes which are in high-resistance contact with the semi-conductive body are termed the emitter electrode and the collector electrode. The electrode which is in low-resistance contact with the semi-conductive body is termed the base electrode. As mentioned above in connection with the junction transistor, point contact transistors of the N and P type will also be referred to hereinafter as opposite conductivity types. It is, however, noted that an N type point contact transistor is of the same conductivity type as a P–N–P junction transistor.

Transistors have been applied to signal amplifier circuits having parallel signal paths to provide push-pull operation. It has been found, however, that these circuits may require adjustment upon substitution of transistors due to the fact that each of the signal paths should have identical characteristics statically and dynamically in order to provide stability in operation and substantially distortionless signal output. It has been found, however, that even though transistors are manufactured with an attempt to provide uniformity of characteristics, the ultimate characteristics of the units may vary within wide limits. This variation of transistor characteristics may cause a circuit which has been properly adjusted for one set of transistors to operate unsatisfactorily with a substitute set of transistors. It has also been found that due to the fact that there are parallel signal paths, there is a required symmetry of operation between the two signal paths. Consequently, a difference of transistor characteristics between the transistor or transistors utilized in one of the signal paths and the characteristics of the transistor or transistors utilized in the other signal path may result in unstable operation and distortion.

Accordingly, it is an object of the present invention to provide an improved substantially distortionless semi-conductor amplifier circuit of the push-pull type.

It is another object of the present invention to provide an improved class B push-pull semi-conductor amplifier circuit which is substantially free from crossover distortion.

It is still another object of the present invention to provide an improved semi-conductor amplifier circuit which enables stable push-pull class B operation with semi-conductor devices having a wide variety of operating characteristics while introducing substantially no crossover distortion.

In accordance with one embodiment of the present invention, a pair of semi-conductor devices or transistors of opposite conductivity type are connected in parallel between an amplifier input and output circuit terminals, that is, corresponding input electrodes of the transistors are connected to a terminal of the input circuit and corresponding output electrodes of the transistors are connected to a terminal of the output circuit. One electrode of each transistor is common to the input and output circuits. Appropriate bias voltages are applied as described more fully herein. Crossover distortion is prevented, in general, by connecting an impedance element in the input circuit between the input electrodes of the pair of transistors. Accordingly, a bias voltage is provided such that the input electrodes may both be slightly biased in the forward direction. Since the characteristics of the two signal paths are maintained substantially equal but of opposite conductivity type, a single-ended input signal results in push-pull amplification without distortion.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
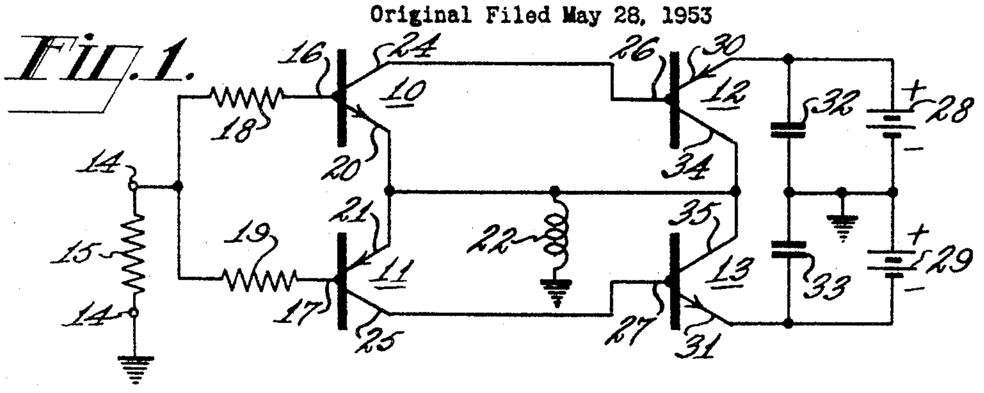
Figure 1 is a schematic circuit diagram of a semi-conductor amplifier circuit embodying the present invention.

Referring now to the drawing wherein like elements have been designated by the same reference characters throughout the various figures, and particularly to Figure 1 four transistors 10, 11, 12 and 13, which may be junction transistors, are connected in a parallel path signal amplifier circuit. Input signals for the driving amplifier may be applied to an input circuit comprising a pair of input terminals 14 and an input resistor 15. The high voltage terminal of the input terminals 14 is coupled to each of the base electrodes 16 and 17 by means of a pair of equalizing resistors 18 and 19 as provided in accordance with the present invention. The other terminal of the input terminals 14 may be connected to a point of fixed reference potential such as ground. The emitter electrodes 20 and 21 of the respective driving transistors 10 and 11 are connected in common to the high voltage terminal of an output impedance illustrated as an inductor 22, which could be the voice coil of a loudspeaker, for example, which has resistance. It is, of course, to be understood that this output impedance may take substantially any form, and may be a resistor, for example. In order to provide driving currents from the output transistors 12 and 13, the collector electrodes 24 and 25 of the respective driving transistors 10 and 11 are directly connected to the base electrodes 26 and 27 of the respective output transistors 12 and 13.

Bias voltages for the circuit are provided by a pair of batteries 28 and 29 which are respectively connected between the emitter electrodes 30 and 31 and a point of fixed reference potential such as ground. The batteries 28 and 29 may be bypassed for alternating current frequencies by a pair of capacitors 32 and 33. The circuit of the output transistors 12 and 13 is completed by connecting their respective collector electrodes 34 and 35 to the high voltage terminal of the load impedance element 22.

While it will be understood that the circuit specifications may vary according to the design for any particular application the following circuit specifications are included by way of example only.

| | | |
|---|---|---|
| Transistor 10 and 13 | | 2N34 |
| Transistor 10 and 11 | | 2N35 |
| Resistor 18 and 19 | ohms | 3,000 |
| Battery 28 and 29 | volts | 7.5 |
| Voice coil 22 | ohms | 16 |

As to the operation of the circuit illustrated in Figure 1, let it first be assumed that the equalizing resistors 18 and 19, provided in accordance with the present invention, have been omitted and that the circuit has been adjusted for class B operation. Under these conditions, it is readily seen that if the characteristics of the transistors 10 and 12 in one of the parallel paths differs from the characteristics of the transistors 11 and 13 in the other of the parallel paths, a differential current will flow through the load impedance element 22 developing a direct current voltage thereacross which will be a static bias applied to the emitter electrodes 20 and 21. It is also to be noted that a leakage current due to the leakage across the collector junction in each of the two transistors 10 and 11 may be flowing in the base electrodes 16 and 17. This leakage current is in a direction opposite to the normal base current which is produced by forward bias between the base and its respective emitter electrode.

Accordingly a current in the base electrode 16 produced by this leakage will be flowing out of the base electrode 16 and the current flowing in the base electrode 17 produced by the leakage current will be flowing into the base electrode 17. The resulting static bias appearing at the base electrodes 16 and 17 will then be the voltage drop appearing across the input resistor 15 which is produced by the algebraic sum of the base currents flowing therethrough.

Under these conditions let it be assumed that the unbalance in the two parallel paths is such as to produce a differential current through the load impedance 22 in such a direction as to develop a negative voltage across the load impedance 22 with respect to ground. Accordingly, a forward bias will appear between the base electrode 16 and its corresponding emitter electrode 20 thereby reducing the base current. However, the reverse bias appearing between the base electrode 17 and its corresponding emitter electrode 21 is maintained since it is impossible to have both transistors biased in the forward direction if their base electrodes and emitter electrodes are connected together.

The result of this forward bias applied between the base and emitter electrodes of the transistor 10 is to increase the current of the output transistor 12 and thus decrease the differential current flowing through the output impedance 22. However, to accomplish this result it is necessary that the bias between the base electrode 16 and the emitter electrode 20 remain in a forward direction, and, therefore, the emitter electrode 20 must remain slightly negative with respect to its corresponding base electrode 16. It is thus readily seen that without the benefit of the present invention unequal bias conditions may exist as to the two parallel signal paths, and accordingly crossover distortion will result when an alternating current signal is applied thereto.

Now let it be assumed that two equalizing resistors 18 and 19 have been added and the circuit as in accordance with the present invention as illustrated in Figure 1. The effect of these two equalizing resistors in combination with the leakage current above referred to is to provide a small amount of forward bias on both of the transistors 10 and 11. That is to say, the leakage current flow in the transistor 10 is out of the base 16 which will tend to forward bias the emitter-base diode of the transistor 10 due to the voltage drop across the resistor 18. The leakage flow in the transistor 11, on the other hand, is into the base 17 which will tend to forward bias the emitter-base diode of the transistor 11 due to the voltage drop across the resistor 19. Thus the voltage between the emitter electrodes and their respective base electrodes is such as to make each emitter capable of emitting minority carriers. The equilibrium condition described previously does not now cut off or apply a further reverse bias between the base electrode 17 and the emitter electrode 21 since it is possible for each of the base electrodes to be at different potentials. Therefore, both units may be biased in a forward direction even though each emitter electrode is connected to a common point.

When a positive pulse of input signal is applied to the input electrodes 14, the current flowing in the base electrode 16 will increase slightly and saturate at the leakage value. The leakage current in the base electrode 17 will decrease, pass through zero, and reverse as the signal becomes more positive. However, it is seen that the crossover is smooth and not notched as there is no time during which the emitter electrodes are not in condition to emit minority carriers.

Figure 2:
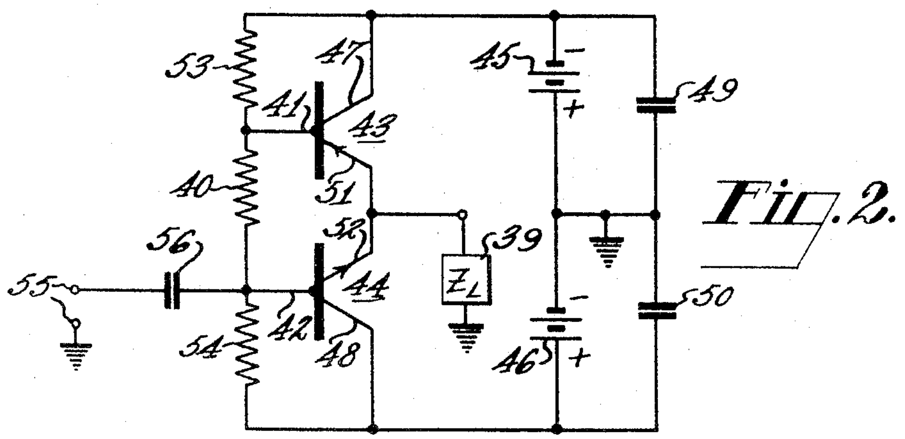
Figure 2 is a schematic circuit diagram of a semi-conductor amplifier circuit illustrating a further embodiment of the present invention.

The schematic circuit diagram shown in Figure 2 illustrates a further modification of the present invention as applied to a single pair of junction transistors 43 and 44. Accordingly, an impedance element illustrated as a resistor 40 is connected between the base electrodes 41 and 42 of a pair of semi-conductor devices 43 and 44 which are arranged as a parallel path signal amplifier, better known as a complementary symmetry class B push-pull amplifier. Bias voltages for this circuit are provided by a pair of voltage sources illustrated as batteries 45 and 46 connected respectively between the collector electrodes 47 and 48 and ground. The batteries 45 and 46 may be bypassed for alternating current signals by a pair of capacitors 49 and 50. A load impedance element 39 illustrated as a rectangle containing the legend $Z_L$ is connected between a point of fixed reference potential such as chassis ground and the two emitter electrodes 51 and 52.

Static bias is provided for the base electrodes 41 and 42 by means of a bias or voltage divider network comprising two resistors 53 and 54 connected in series with the resistor 40 between the collector electrodes 47 and 48. The base electrode 41 is connected to the junction of the voltage dividing resistor 53 and the resistor 40 and the base electrode 42 is connected to the junction of the voltage dividing resistor 54 and the equalizing resistor 40 of relatively low resistance, for example approximately 30 ohms. An input signal may be applied simultaneously to the base electrodes 41 and 42 in substantially the same phase and amplitude by means of a pair of input terminals 55, one of which is connected to signal current ground and the other of which is connected to the base electrode 42 through a coupling capacitor 56.

A difference in the operating characteristics of the two transistors 43 and 44 may result in a differential current flowing through the load impedance 39 which will, in turn, cause a static bias voltage to be developed thereacross. This static bias voltage will be simultaneously applied between the emitter electrodes 51 and 52 and the corresponding base electrodes 41 and 42. With the circuit adjusted for class B operation, leakage currents in the two transistors 44 and 43 may result in reverse base current flowing in each of the base electrodes 41 and 42. Accordingly the leakage current flowing in the base electrode 41 will be flowing into the base electrode 41 and the leakage current flowing in the base electrode 42 will be flowing out of the base electrode 42.

Under these circumstances it is readily seen as above discussed that the static bias which is developed by the differential current across the load impedance 39 is such as to oppose the effect of the current in one of the two transistors but the effect of the leakage current in the other of the two transistors remains unaffected. This, of course, will result in crossover distortion when an alternating current signal is applied to the input terminals 55.

However, the addition of the bias network comprising the voltage dividing resistors 53 and 54 and the equalizing resistor 40 provides a voltage bias between the bases 41 and 42 to overcome this difficulty.

The values of the voltage dividing resistors 53 and 54 and the equalizing resistor 40 are chosen initially to provide a proper bias between the base electrode 41 and its corresponding emitter electrode 51 and between the base electrode 42 and its corresponding emitter electrode 52. For class B operation these bias voltages will be small. A small voltage difference exists between the two base electrodes 41 and 42 due to the voltage drop across the equalizing resistor 40 of relatively low resistance value. Accordingly, the divider network comprising the two voltage dividing resistors 53 and 54 and the equalizing resistor 40 provides a slightly forward bias between each of the base electrodes 41 and 42 and their corresponding emitter electrodes 51 and 52.

If, as would be conventional, the equalizing resistor 40 were omitted from the circuit, one of the transistors would ordinarily be reverse biased. However, it is readily seen that the voltage difference existing between the base electrodes 41 and 42 prevents such a condition and forward biases the emitters both of transistors relative to their respective bases thereby providing operation without crossover distortion. In accordance with the present invention, it is preferred that the resistance of the compensating element 40 be low compared to the input impedance of the transistors and that the current which flows in the resistive network 53, 40, 54 with the transistors disconnected be large compared to any expected base leakage currents. Because of the low resistance path connecting the base electrodes 41 and 42, the input signal is applied in substantially the same phase and amplitude to each of the base electrodes.

Figure 3:
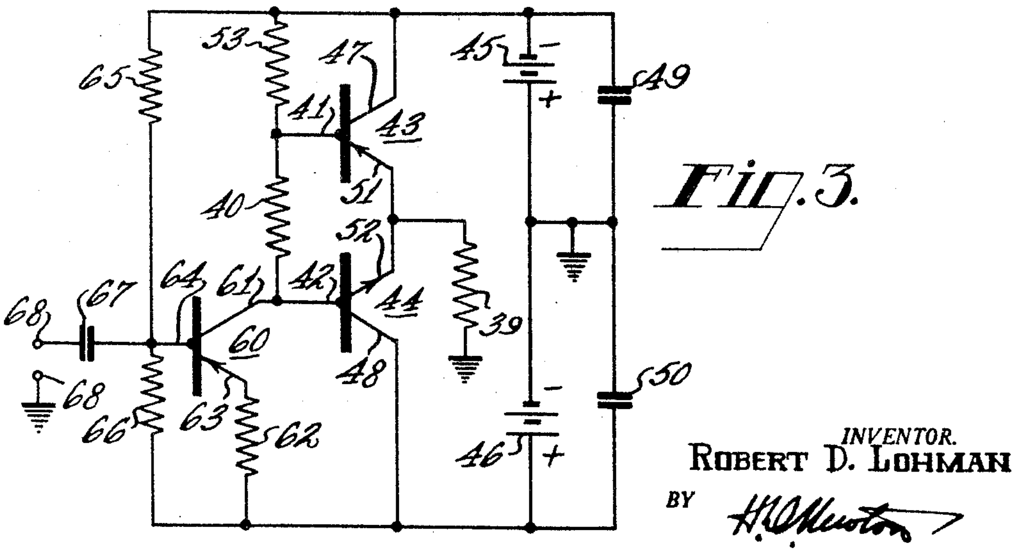
Figure 3 is a schematic circuit diagram of a semi-conductor amplifier circuit in accordance with with present invention and illustrating a modification of the schematic circuit diagram shown in Figure 2.

Figure 3 illustrates the application of the present invention to a pair of semi-conductor devices 43 and 44 arranged in a parallel path signal amplifier circuit substantially identical with that shown in Figure 2. However, in this instance a driving transistor 60 is utilized as the signal source for the parallel path signal amplifier and accordingly the collector electrode 61 is connected directly to the base electrode 42.

An emitter impedance element illustrated as a resistor 62 is connected between the emitter electrode 63 and the positive terminal of the battery 46. Proper biasing voltage for the base electrode 64 is provided by a pair of bias resistors 65 and 66 which are connected in series arrangement between the negative terminal of the battery 45 and the positive terminal of the battery 46. The base electrode 64 is connected directly to the junction of these two bias resistors 65 and 66. An input signal may be applied to the transistor 60 by means of a coupling capacitor 67 which is connected between the base electrode 64 and one of a pair of input terminals 68, the other of the pair of input terminals 68 may be connected directly to signal ground.

In operation this circuit is substantially identical with the operation of the circuit above described in connection with Figure 2. It may be noted that in this instance the transistor 60 with its emitter resistor 62 replaces the voltage dividing resistor 54 above described. The compensating action as provided by the resistor 40 as part of the voltage divider network is substantially identical to that above noted and the emitter-base circuits of each of the output transistors will be biased in the forward direction.

It will be appreciated that while this invention has been described by reference to point contact and junction transistors that it is in no way limited to transistors of these specific forms. Other types which have symmetrical operating characteristics in the N and P forms may also be used in the practice of this invention even though they may differ in a detailed manner by which the output currents are controlled by the input currents and voltages.

It is thus readily seen that the present invention provides a semi-conductor amplifier circuit which is capable of providing push-pull output with a minimum of distortion. It is to be understood that specific embodiments of the invention shown and described are illustrative and that various modifications may be made therein without departing from the scope and spirit of this invention.

What is claimed is:

1. In a push-pull class B signal amplifier circuit, the combination comprising, a first transistor of one conductivity type including a first emitter, a first base, and a first collector electrode; a second transistor of an opposite conductivity type including a second emitter, a second base, and a second collector electrode; input circuit means connected for simultaneously applying an input signal to said first and second base electrodes; load impedance means connected with said first and second emitter electrodes for developing a push-pull output signal; means providing a direct-current supply source for said circuit connected with said first and second collector electrodes for applying biasing potentials thereto; and means providing a voltage divider network including first impedance means connected between said first base electrode and said source, second impedance means connected between said second base electrode and said source, and a resistor having relatively low resistance connected between said first and second base electrodes; said voltage divider network providing forward bias between said first emitter and first base electrodes and between said second emitter and second base electrodes to reduce crossover distortion in said amplifier circuit.

2. In a push-pull class B signal amplifier circuit the combination comprising, a first transistor of one conductivity type including a first base, a first emitter, and a first collector electrode; a second transistor of an opposite conductivity type including a second base, a second emitter, and a second collector electrode; input circuit means connected for simultaneously applying an input signal to said first and second base electrodes; means directly connecting said first emitter electrode with said second emitter electrode; load impedance means connected with said first and second emitter electrodes for developing a push-pull output signal; means providing a direct-current supply source for said circuit connected with said first and second collector electrodes for applying biasing potentials thereto; and means providing a voltage divider network including a first resistor connected between said first base electrode and said source, a second resistor having low resistance relative to the input impedance of the transistors connected between said first and second base electrodes, and impedance means connected between said second base electrode and said source; said voltage divider network providing forward bias between said first emitter and first base electrodes and between said second emitter and second base electro 'es to reduce crossover distortion in said amplifier circuit.

3. A push-pull amplifier circuit as defined in claim 2 wherein said impedance means comprises a third resistor.

4. A push-pull amplifier circuit as defined in claim 2 wherein said impedance means comprises a third transistor.

5. A push-pull class B signal amplifier circuit comprising, in combination, a first transistor of one conductivity type including a first base, a first emitter, and a first collector electrode; a second transistor of an opposite conductivity type including a second base, a second emitter, and a second collector electrode; means directly connecting said first emitter electrode with said second emitter electrode; load impedance means connected with said first and second emitter electrodes for developing a push-pull output signal; means providing a direct-current supply source for said circuit connected with said first and second collector electrodes for applying biasing potentials thereto; and means providing a voltage divider network including a first resistor connected between said first base electrode and said source, a second resistor having relatively low resistance connected between said first and second base electrodes, and a third transistor connected between said second base electrode and said source; said third transistor including a third collector electrode direct-current conductively connected with said second base electrode and a third emitter electrode connected with said source; said voltage divider network providing forward bias between said first emitter and first base electrodes and between said second emitter electrodes and second base electrodes to reduce crossover distortion in said amplifier circuit.

6. A push-pull class B signal amplifier circuit comprising, in combination, a first transistor of one conductivity type including a first base, a first emitter, and a first collector electrode; a second transistor of an opposite conductivity type including a second base, a second emitter, and a second collector electrode; means directly connecting said first emitter electrode with said second emitter electrode; load impedance means connected with said first and second emitter elecrodes for developing a push-pull output signal; means providing a direct-current supply source for said circuit connected with said first and second collector electrodes for applying biasing potentials thereto; a first resistor connected between said first base electrode and said source; a second resistor having relatively low resistance connected between said first and second base electrodes and providing a direct-current conductive path therebetween; a third transistor of said one conductivity type including a third base, a third emitter, and a third collector electrode; input circuit means connected for applying an input signal between said third base and third emitter electrodes; means direct-current conductively connecting said third collector electrode with said second base electrode; and means connecting said third emitter and third base electrodes with said source; said first and second resistors and said third transistor comprising a voltage dividing network for forward biasing said first emitter and first base electrodes and said second emitter and second base electrodes to reduce crossover distortion in said amplifier circuit.

References Cited in the file of this patent

UNITED STATES PATENTS

| | | |
|---|---|---|
| 2,217,269 | Foster | Oct. 8, 1940 |
| 2,647,958 | Barney | Aug. 4, 1953 |
| 2,651,685 | Tharp | Sept. 8, 1953 |
| 2,652,460 | Wallace | Sept. 15, 1953 |
| 2,666,818 | Shockley | Jan. 19, 1954 |
| 2,666,819 | Raisbeck | Jan. 19, 1954 |

FOREIGN PATENTS

| | | |
|---|---|---|
| 665,867 | Great Britain | Jan. 30, 1952 |